(12) United States Patent
Botker

(10) Patent No.: US 7,167,051 B2
(45) Date of Patent: Jan. 23, 2007

(54) CURRENT-MODE INSTRUMENTATION AMPLIFIER

(75) Inventor: Thomas L. Botker, Tucson, AZ (US)

(73) Assignee: Analog Devices, Inc., Norwood, MA (US)

( * ) Notice: Subject to any disclaimer, the term of this patent is extended or adjusted under 35 U.S.C. 154(b) by 104 days.

(21) Appl. No.: 11/154,135

(22) Filed: Jun. 15, 2005

(65) Prior Publication Data

US 2005/0275460 A1 Dec. 15, 2005

Related U.S. Application Data

(60) Provisional application No. 60/580,295, filed on Jun. 15, 2004.

(51) Int. Cl.
*H03F 3/45* (2006.01)

(52) U.S. Cl. ..................... 330/257; 330/253

(58) Field of Classification Search ............. 330/252, 330/253, 257, 261, 69
See application file for complete search history.

(56) References Cited

U.S. PATENT DOCUMENTS

| | | | | |
|---|---|---|---|---|
| 4,881,045 A * | 11/1989 | Dillman | ..................... | 330/253 |
| 6,538,503 B2 | 3/2003 | Burt | ............................. | 330/9 |
| 6,639,460 B1 | 10/2003 | Botker | ......................... | 330/9 |
| 6,653,894 B2 | 11/2003 | Botker | ......................... | 330/9 |
| 6,753,730 B2 * | 6/2004 | Yamamoto | .................. | 330/253 |
| 6,919,766 B2 * | 7/2005 | Suzuki | ....................... | 330/252 |
| 2002/0190734 A1 | 12/2002 | Burt et al. | | |

OTHER PUBLICATIONS

Burr-Brown Products, "Precision, Rail-to-Rail I/O Instrumentation Amplifier", Nov. 2004, pp. 1-21.

* cited by examiner

*Primary Examiner*—Henry Choe
(74) *Attorney, Agent, or Firm*—Koppel, Patrick & Heybl

(57) ABSTRACT

A current-mode instrumentation amplifier (IA) includes first and second buffer amplifiers which receive a differential voltage (VINP–VINN) and provide output voltages at respective output nodes; a resistance R1 is connected between the nodes and conducts a current $I_{R1}$ that varies with VINP–VINN. In one embodiment, each amplifier includes a transistor connected in series with R1 which conducts current $I_{R1}$; these currents are coupled to the input and output terminals of a current mirror, preferably via respective virtual ground nodes such that the IA requires only one current mirror, to produce the IA's output voltage. To minimize DC mismatch errors, the IA is chopper-stabilized, with the buffer amplifiers and signal current paths chopped using a two-phase chopping cycle.

24 Claims, 5 Drawing Sheets

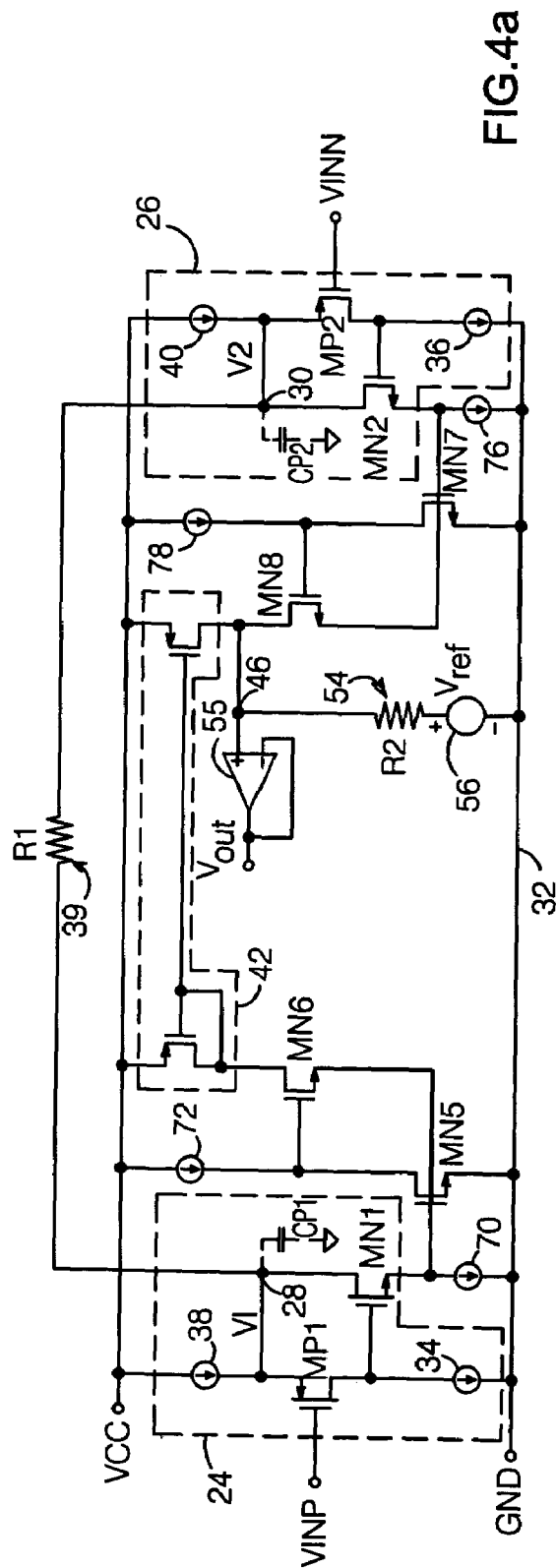
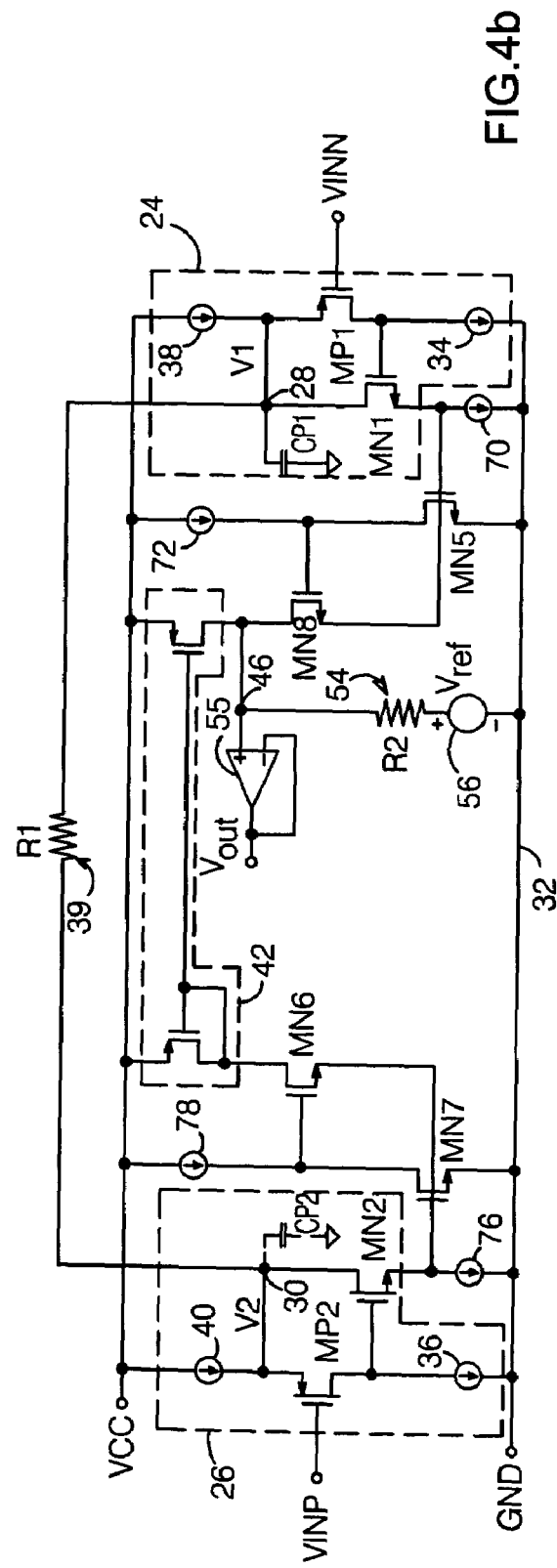
FIG.4a
FIG.4b

CURRENT-MODE INSTRUMENTATION AMPLIFIER

This application claims the benefit of provisional patent application No. 60/580,295 to Botker et al., filed Jun. 15, 2004.

BACKGROUND OF THE INVENTION

1. Field of the Invention

This invention relates to the field of amplifiers, and particularly to current-mode instrumentation amplifiers.

2. Description of the Related Art

An instrumentation amplifier (IA) is a type of amplifier that has been specifically designed to have characteristics suitable for use in measurement and test equipment, such as low DC offset, high common mode rejection (CMR), and high input impedance. Such an amplifier is typically used when a user needs to look at a differential signal in the presence of a common mode signal, which can often be larger than the differential signal of interest.

A well-known IA is shown in FIG. 1. This topology, which employs three operational amplifiers, is commonly used with bipolar and JFET processes to provide an IA with good DC precision. However, this topology has several limitations. For example, the design requires at least six resistors, which generally must be trimmed to achieve the matching required to meet precision specifications such as CMR and gain error. Also, each of the three amplifiers is usually trimmed to ensure good overall DC specifications. Both of these requirements limit the minimum die size of this topology.

The input common-mode voltage and the overall gain of the IA of FIG. 1 limit the range of valid output voltages. The resultant limitation on output swing becomes especially problematic with low supply voltages. Also, when operated from a single supply, the IA's reference pin ($V_{ref}$) must be driven by a low impedance source to maintain good CMR. This is typically done with an additional external amplifier 10 which drives the reference pin to a voltage within the valid output swing of the IA. This external amp adds to the total board space needed for the IA, as well as its total solution cost.

One approach that overcomes some of these limitations is exemplified by the INA326 IA from Texas Instruments. Here, current-mode signal processing is used to provide rejection of common-mode input voltage and power supply variation without the need for accurately matched resistors. However, this design employs four current mirrors, each of which contributes an output-referred voltage error due to device mismatch within each of the mirrors.

SUMMARY OF THE INVENTION

A current-mode instrumentation amplifier is presented which overcomes the problems noted above, providing high DC precision with a small die area.

The present IA employs a current-mode topology. The IA includes first and second input terminals (VINP, VINN) which receive a differential voltage $V_{in}$=VINP−VINN, a resistor having a resistance R1, and first and second buffer amplifiers which receive the differential voltage and provide first and second output voltages V1 and V2 at respective output nodes which vary with VINP and VINN, respectively. With reference to FIG. 2, the first amplifier includes a first transistor (MN1) biased with a bias current $I_{bias1}$=I3−I1 and connected between V1 and a circuit common point, and the second amplifier includes a second transistor (MN2) biased with a bias current $I_{bias2}$=I4−I2 and connected between V2 and the circuit common point.

R1 is connected between the first and second output nodes such that it conducts a current $I_{R1}$ that varies with $V_{in}$. When so arranged, the first transistor conducts a current $I_a$=$I_{bias1}$−$I_{R1}$ when VINP>VINN and a current $I_a$=$I_{bias1}$+$I_{R1}$ when VINP<VINN, and the second transistor conducts a current $I_b$=$I_{bias2}$−$I_{R1}$ when VINN>VINP and a current $I_b$=$I_{bias2}$+$I_{R1}$ when VINN<VINP. Circuitry is provided which couples current $I_a$ to the current input terminal of a current mirror, and couples current $I_b$ to the mirror's current output terminal—which also serves as the IA's current output node. To develop an output voltage, a resistance R2 is typically connected between the current output node and circuit common, and a buffer amplifier connected to the current output node provides the IA's output voltage $V_{out}$. Because each of the first and second transistors carries the signal current in R1, the current in R2 is twice that in R1. Consequently, the gain G of the IA is given by: G=2*(R2/R1) (assuming a current mirror ratio of 1:1). To minimize DC mismatch errors, the present IA is preferably chopper-stabilized and/or auto-zeroed; when chopper-stabilized, both the buffer amplifiers and signal current paths are chopped using a two-phase chopping cycle.

Currents $I_a$ and $I_b$ are preferably coupled to the current mirror using virtual ground nodes which fold the currents in the first and second transistors around to the output node. When so arranged, the IA requires only the one current mirror described above, instead of the multiple mirrors (and their attendant errors) found in prior art IA designs.

In another embodiment of the invention, the buffer amplifiers are arranged such that the amplifier coupled to VINP produces a signal current $I_{vinp}$ equal to (VINP−VINN)/R1 and the amplifier coupled to VINN produces a signal current $I_{vinn}$ equal to (VINN−VINP)/R1. The IA includes a single current mirror having input and output terminals. Signal currents $I_{vinp}$ and $I_{vinn}$ are folded to respective current mirror terminals using, for example, respective transistors or virtual ground nodes; the current mirror's output terminal serves as the IA's current output node. With R2 and a reference voltage $V_{ref}$ connected in series between the current output node and a circuit common point, the IA has a gain G given by: G=2*(R2/R1) and an output voltage at the current output node given by 2*((VINP−VINN)/R1)*R2+$V_{ref}$. Due to the folding of the buffer amplifier currents, only one current mirror is required, while maintaining good common mode rejection versus frequency. This reduces DC errors such as $V_{os}$ and $dV_{os}/dT$, etc.

Further features and advantages of the invention will be apparent to those skilled in the art from the following detailed description, taken together with the accompanying drawings.

BRIEF DESCRIPTION OF THE DRAWINGS

FIGS. 4a and 4b are schematic diagrams of a chopper-stabilized embodiment of an IA per the present invention, as operated during first and second chopping phases, respectively.

DETAILED DESCRIPTION OF THE INVENTION

Figure 2:
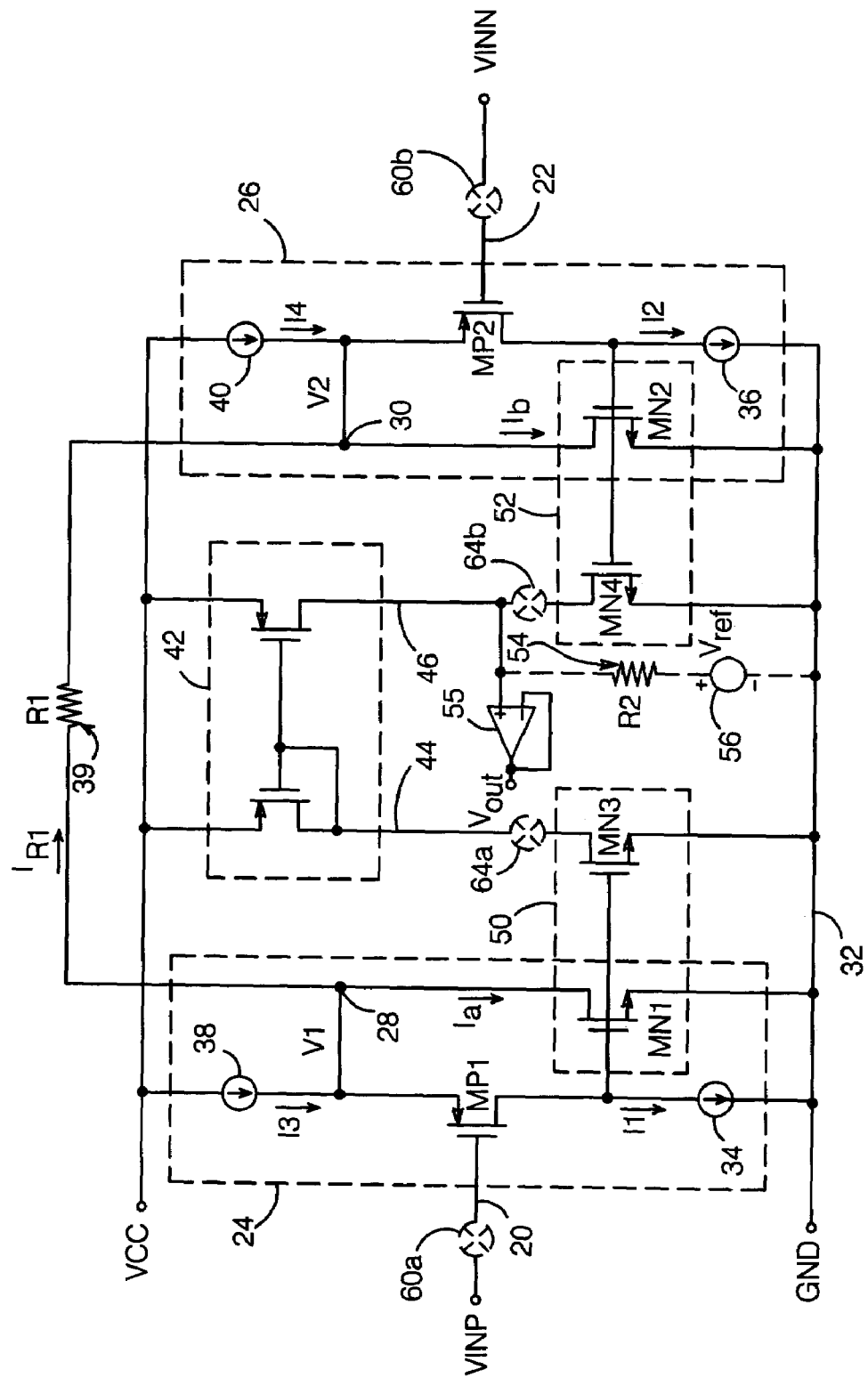
FIG. 2 is a schematic diagram of one embodiment of an IA per the present invention.

One possible embodiment of a current-mode IA per the present invention is shown in FIG. 2. The IA includes differential input terminals VINP and VINN which receive a differential voltage $V_{in}$=VINP−VINN, which are coupled to the input nodes 20, 22 of first and second buffer amplifiers 24, 26, respectively. Buffer amps 24 and 26 produce respective output voltages V1 and V2 at respective output nodes 28, 30, which vary with VINP and VINN; in the embodiment shown in FIG. 2, V1 and V2 are level-shifted by ~1 volt from inputs VINP and VINN, respectively. Buffer amp 24 includes a transistor MN1 connected between output node 28 and a circuit common point 32, and buffer amp 26 includes a transistor MN2 connected between output node 30 and circuit common point 32. Note that, though the transistors depicted in the exemplary embodiments described herein are shown as field-effect transistors (FETs), the invention could also be realized with bipolar transistors, as well as with opposite polarity implementations.

In a typical implementation, input nodes 20 and 22 would be connected to respective input FETs MP1 and MP2, with MP1 biased with a current source 34 which provides a bias current I1, and MP2 biased with a current source 36 which provides a bias current I2. Additional current sources 38 and 40 are connected as shown between a supply voltage (VCC) and nodes 28 and 30. Current sources 38 and 40 provide currents I3 and I4, respectively, such that FET MN1 is biased with a current $I_{bias1}$ approximately given by I3−I1, and FET MN2 is biased with a current $I_{bias2}$ approximately given by I4−I2.

A resistor 39 having a resistance R1 is connected between amplifier output nodes 28 and 30. Since V1≈VINP and V2≈VINN, $V_{in}$ is replicated across R1, causing a current flow of (V1−V2)/R1=$I_{R1}$ in R1. When so arranged, FET MN1 conducts a current $I_a=I_{bias1}-I_{R1}$ when VINP>VINN and a current $I_a=I_{bias1}+I_{R1}$ when VINP<VINN, and FET MN2 conducts a current $I_b=I_{bias2}-I_{R1}$ when VINN>VINP and a current $I_b=I_{bias2}+I_{R1}$ when VINN<VINP.

As discussed in more detail below, the present IA is preferably chopper-stabilized and/or auto-zeroed. When chopper-stabilized, the IA is operated in accordance with a two-phase chopping cycle, with amplifiers 24 and 26, and the signal current paths between the amplifiers and the current mirror, exchanging places between phases. The IA's configuration during one of the chopping phases is shown in FIG. 2.

For the chopping phase shown, a current mirror 42 is arranged to mirror a current applied at a current input terminal 44 to a current output terminal 46, with current output terminal 46 being the IA's current output node. Note that current mirror 42 may itself be chopped (as discussed in more detail below), in which case the functions provided by the mirror's terminals are periodically reversed. Circuitry 50 is arranged to couple current $I_a$ to the current input terminal of current mirror 42, and circuitry 52 couples current $I_b$ to the mirror's current output terminal. One way in which the coupling might be accomplished is shown in FIG. 2, in which FETs MN3 and MN4 serve as mirror transistors which mirror $I_a$ and $I_b$ to mirror terminals 44 and 46, respectively. The present IA typically includes a resistor 54 having a resistance R2 connected between current output node 46 and circuit common (or to a reference voltage $V_{ref}$, discussed below), and a buffer amplifier 55 connected to the current output node which provides the IA's output voltage $V_{out}$.

Assuming there are no device mismatches, it can be seen that a voltage approximately equal to input voltage $V_{in}$ is applied across R1. The resulting current ($I_{R1}$) flows through MN1 and MN2, with both the MN1 and MN2 currents coupled to current output node 46. For the chopping phase shown, when VINP is positive with respect to VINN, the current in MN3 decreases by $\sim V_{in}/R1$ while the current in MN4 increases by the same amount, such that the current that flows into R2 is twice the value that flows into R1. Consequently, the gain $G=(V_{out}-V_{ref})/V_{in}$ of this current mode topology is given by G=−2*(R2/R1) ($V_{ref}$ is discussed below). Note that for proper operation, the ratio of input current to output current for current mirror 42 should be one.

In some applications, it may be necessary to provide a means to set output voltage $V_{out}$ to a center value when VINP−VINN is equal to a predetermined value, typically zero. If the IA is powered by dual supplies, the center value would typically be set to ground; if a single supply is used, the center value would often be set to VCC/2. One means of setting the center value, shown in FIG. 2, is to connect a reference voltage source 56 in series with R2, with its output voltage $V_{ref}$ selected to provide the desired center value.

Resistances R1 and R2 are chosen to set the desired gain needed for a particular application. Resistance R1 should be made large enough so that the current it diverts from the buffer amplifiers will not cause any of the amplifiers' devices to be turned off. This can be a significant problem with large input signals, so the value of R1 typically must be larger for low gains than for high gains, where the input signal range is more limited.

Note that this topology is relatively insensitive to additional series wiring resistance in either R1 or R2. This added resistance only results in a small change in gain, but the CMR of the IA is not degraded. Furthermore, common mode input movement produces currents that cancel at R2, thereby providing an excellent CMR without the need for perfectly matched resistors.

Note that circuit common point 32 is shown as being "ground", but this is not essential; other fixed voltages might also be used.

For the $I_a$ and $I_b$ equations noted above to be correct, I3 should be greater than I1 and I4 should be greater than I2, such that an input signal current applied to MN1 or MN2 appears as a small signal.

The IA of FIG. 2 is preferably chopper-stabilized and/or auto-zeroed to eliminate DC mismatch errors. When chopper-stabilized, the IA is operated in accordance with a two-phase chopping cycle, with amplifiers 24 and 26, and the signal current paths between the amplifiers and the current mirror, exchanging places between phases; a duty cycle of 50% is preferred. This requires the use of a number of switches 60a/60b and 64a/64b. During the first phase of the chopping cycle, the IA is configured as shown, with switches 60a and 60b arranged to connect input node 20 to VINP and input node 22 to VINN, switch 64a arranged to connect the drain of MN3 to current mirror terminal 44, and switch 64b arranged to connect the drain of MN4 to output node 46. During the second phase of the chopping cycle, the positions of amplifiers 24 and 26 are swapped, such that input nodes 20 and 22 are connected to VINN and VINP, respectively, the drain of MN3 is connected to output node 46, and the drain of MN4 is connected to current mirror terminal 44. In this way, both the amplifiers and the signal current paths are chopped, thereby making it possible to eliminate trimming steps that might otherwise be necessary.

To further reduce DC mismatch errors, current mirror 42 can be implemented as a chopped mirror and/or as a cascoded mirror (not shown). Note that, if implemented as a chopped mirror, the chopping frequency used for mirror 42 should be different than that used for switches 60a/60b and 64a/64b, to ensure that errors that might otherwise arise due to mismatch between the mirror's transistors are cancelled.

Figure 3:
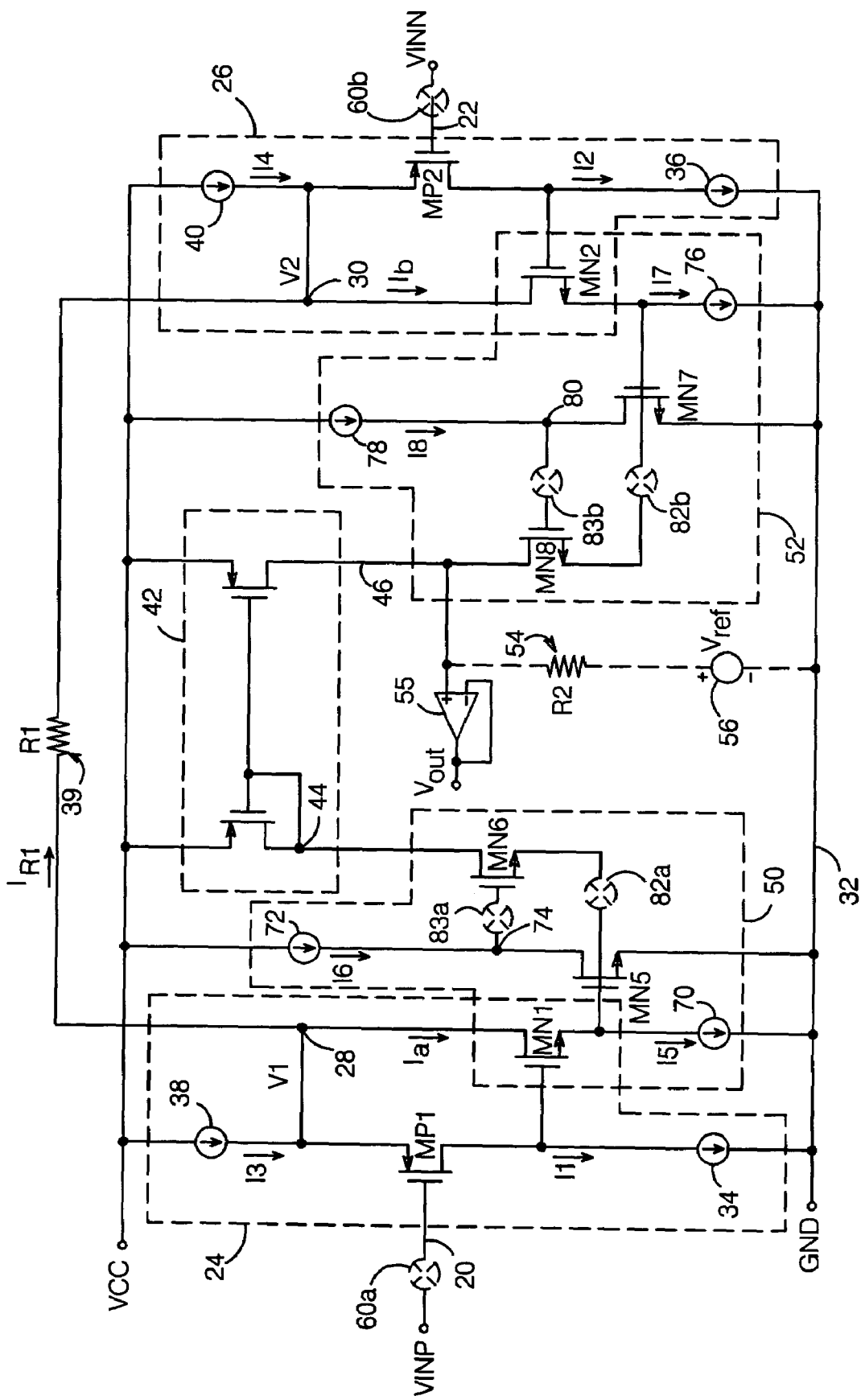
FIG. 3 is a schematic diagram of a preferred embodiment of an IA per the present invention.

A preferred embodiment of the present IA is shown in FIG. 3. This implementation is similar to that of FIG. 2, except for the realization of current coupling circuitry 50 and 52. Here, circuitry 50 includes current sources 70 and 72 and FETs MN5 and MN6. Current source 70 provides a current I5 and is connected between the source of MN1 and circuit common point 32. Current source 72 provides a current I6 and is connected between supply voltage VCC and a node 74. FET MN5 has its gate coupled to the source of MN1, its source connected to circuit common point 32, and its drain connected to node 74, and FET MN6 has its gate coupled to node 74, its source coupled to the gate of MN5, and its drain connected to the current input node 44 of current mirror 42.

Similarly, circuitry 52 includes current sources 76 and 78 and FETs MN7 and MN8. Current source 76 provides a current I7 and is connected between the source of MN2 and circuit common point 32. Current source 78 provides a current I8 and is connected between supply voltage VCC and a node 80. FET MN7 has its gate coupled to the source of MN2, its source connected to circuit common point 32, and its drain connected to node 80, and FET MN8 has its gate coupled to node 80, its source coupled to the gate of MN7, and its drain connected to the current output node 46 of current mirror 42.

When so arranged, MN5/MN6 and MN7/MN8 form virtual ground nodes that fold the currents in MN1 and MN2 around to current output node 46, with the MN1 current conveyed to node 46 via current mirror 42 (for the chopping phase shown). When VINP is positive with respect to VINN, the current in MN6 increases by $V_{in}/R1$ while the current in MN8 decreases by the same amount; the opposite occurs when VINN is positive with respect to VINP. Currents I5 and I7 are fixed such that, when $I_{R1} \neq 0$, the difference between I5 and $I_a$ must be provided by MN6 and mirrored to current output node 46, and the difference between I7 and $I_b$ is conducted from current output node 46 by MN8. FET MN5 and current source 72 act to stabilize the node voltage at the gate of MN5 and source of MN6 (or MN8, depending on chopping phase), and FET MN7 and current source 78 stabilize the node voltage at the gate of MN7 and source of MN8 (or MN6, depending on chopping phase).

For the $I_a$ and $I_b$ equations noted above to be correct for this embodiment, I3 should be greater than I1 and I4 should be greater than I2, such that an input signal applied to MN1 or MN2 appears as a small signal. For best performance, I5 should be greater than $I_{bias1}$, and I7 should be greater than $I_{bias2}$, such that signal currents in MN6 and MN8 appear as small signals. As with the embodiment shown in FIG. 2, the IA shown in FIG. 3 can be chopper stabilized to eliminate DC mismatch errors. For the chopping phase shown in FIG. 3, switches 60a and 60b are connected between input nodes 20 and 22 and VINP and VINN, respectively, a switch 82a is connected between the source of MN6 and the gate of MN5, a switch 82b is connected between the source of MN8 and the gate of MN7, a switch 83a is connected between the gate of MN6 and node 74, and a switch 83b is connected between the gate of MN8 and node 80, such that both the buffer amplifiers and the signal current paths are chopped. The operation of a chopper-stabilized version of the IA of FIG. 3 during the first and second chopping phases is shown in FIGS. 4a and 4b, respectively. Amplifiers 24 and 26 exchange positions from FIG. 4a to FIG. 4b, thereby enabling DC mismatches within the amplifiers and the current sources to be largely eliminated. For example, assume that VINP–VINN=1V, and amplifier 24 has a 10 mV input offset voltage. During the first chopping phase, the buffer amplifiers apply 1V+10mv=1.01V across R1, whereas during the second chopping phase the amplifiers apply 0.99V across R1. As a result, the average differential input voltage applied across R1 over the full chopping cycle is 1V.

As with the embodiment shown in FIG. 2, DC mismatch errors can be further reduced by implementing current mirror 42 as a chopped mirror, and/or as a cascoded mirror (not shown).

Another advantage of this topology is that parasitic capacitance on output nodes 28 and 30 (CP1, CP2, shown in FIGS. 4a and 4b) does not cause a degradation in CMR versus frequency. As common mode input voltage increases, parasitic capacitances CP1 and CP2 need to be charged. As a result, the currents in MN6 and MN8 will increase. But, if CP1 and CP2 are balanced, the amount that the MN6 current changes will match the change in MN8. Consequently, the average current into R2 will not change, thereby providing a good CMR versus frequency characteristic.

It should further be noted that the topology shown in FIG. 3 employs a single current mirror, instead of the multiple mirrors found in prior art IA designs and which can contribute offset, offset drift and DC errors to the IA output. By eliminating all but one current mirror in accordance with the present invention, errors associated with the other mirrors are eliminated.

Figure 1:
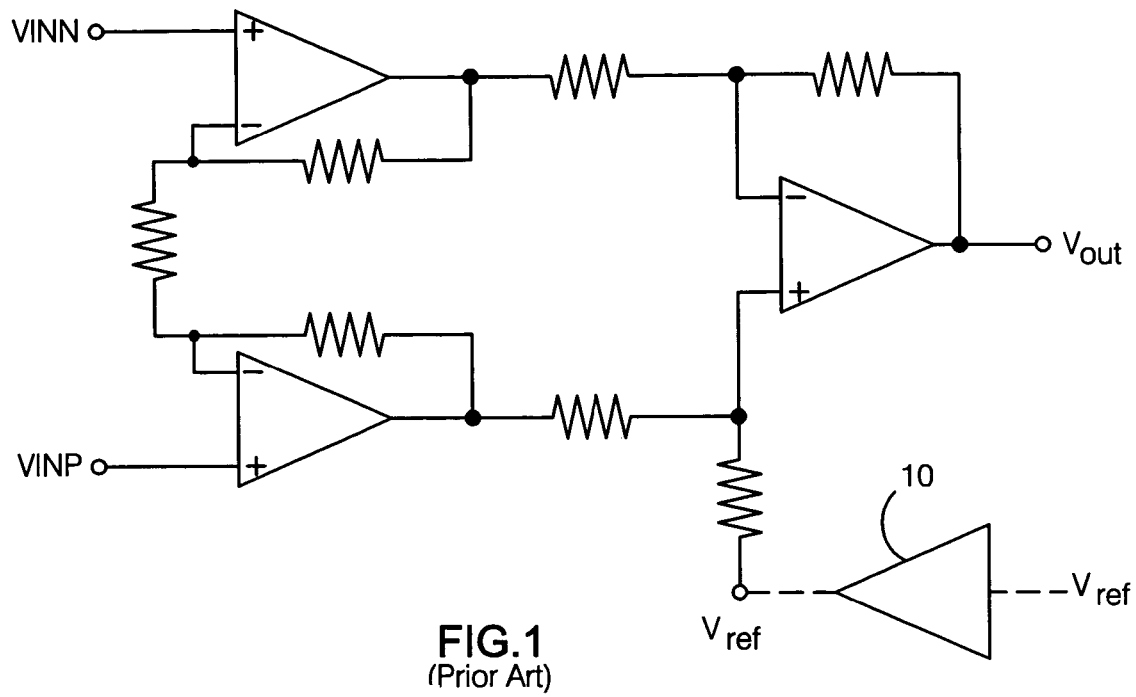
FIG. 1 is a schematic diagram of a prior art IA.
Figure 5:
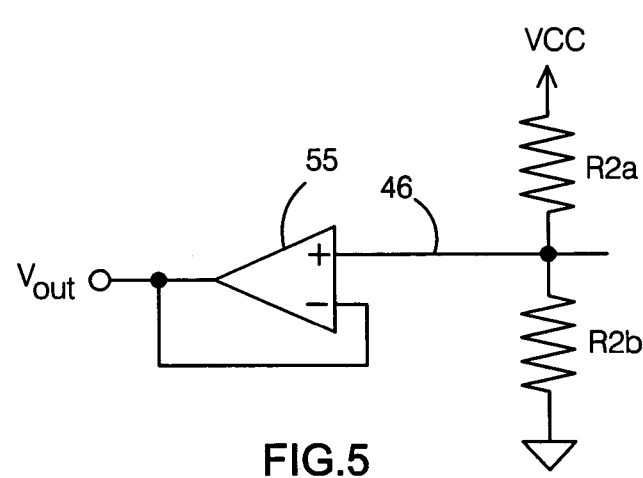
FIG. 5 is a schematic diagram of a reference voltage source as might be used with an IA per the present invention.

An alternative means of setting output voltage $V_{out}$ to a center value when VINP–VINN is equal to a predetermined value is shown in FIG. 5. Here, resistor R2 and reference voltage source 56 are replaced with a divider comprising resistors R2a and R2b, chosen to bias current output node 46 as needed without needing an external amplifier. This is desirable, because it allows a user using a single supply to avoid the cost and board space needed for an external amplifier to bias the output within the valid output range of the IA.

Figure 6:
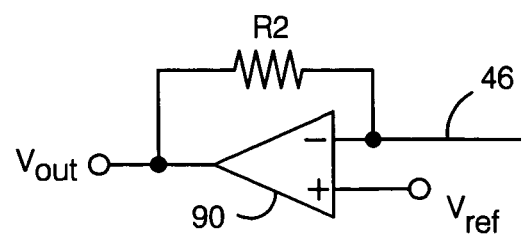
FIG. 6 is a schematic diagram of an output circuit as might be used with an IA per the present invention.

Another possible means of setting output voltage $V_{out}$ to a center value is shown in FIG. 6. Here, an amplifier 90 is connected to current output node 46 at its inverting input, and to $V_{ref}$ at its non-inverting input. Resistor R2 is connected between the output and inverting input of amplifier 90 and sets the IA's gain G=2*(R2/R1). The voltage at node 46, and thus $V_{out}$, is set by $V_{ref}$. Note that for the previous embodiments, a positive current into node 46 caused an increase in $V_{out}$. Here, a negative current into node 46 causes an increase in $V_{out}$; as such, the inputs of amplifier 90 are reversed with respect to those of amplifier 55 in FIGS. 2, 3, 4a, 4b and 5.

Figure 7:
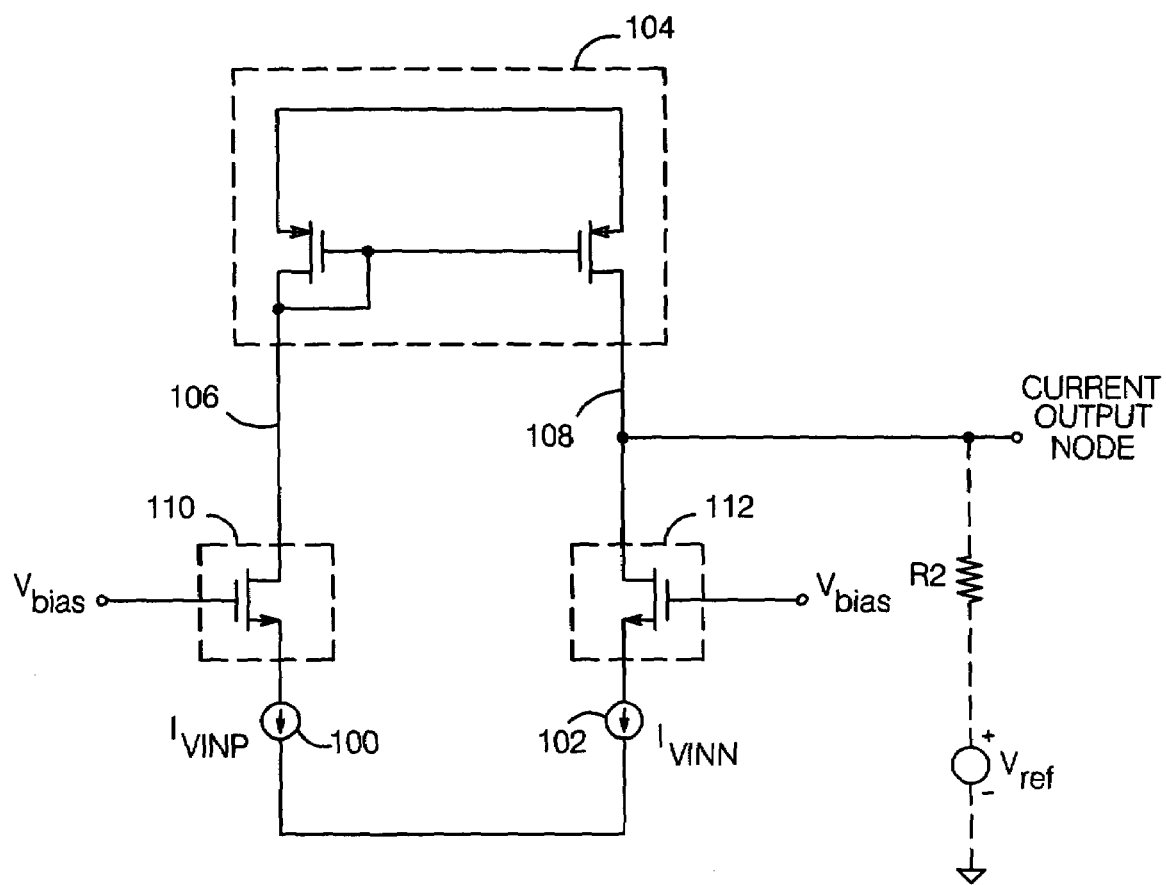
FIG. 7 is a schematic diagram of another embodiment of an IA per the present invention.

Another possible embodiment of an IA per the present invention is shown in FIG. 7. This embodiment assumes (but does not show) first and second input terminals which receive a differential voltage (VINP–VINN), first and second buffer amplifiers which receive the differential voltage and provide first and second output voltages at respective output nodes which vary with VINP and VINN, respectively, and a resistance R1 connected between the output nodes. The amplifiers are arranged such that the amplifier coupled to VINP produces a signal current $I_{vinp}$ equal to (VINP−VINN)/R1 and the amplifier coupled to VINN produces a signal current $I_{vinn}$ equal to (VINN−VINP)/R1. Signal currents $I_{vinp}$ and $I_{vinn}$ are represented in FIG. 7 with current sources 100 and 102, respectively.

The IA includes a current mirror 104 having an input terminal 106 and an output terminal 108; terminal 108 serves as the IA's current output node. Respective current folding circuits 110 and 112 fold signal currents $I_{vinp}$ and $I_{vinn}$ to respective current mirror terminals. With a resistance R2 and a reference voltage $V_{ref}$ connected in series between the current output node and a circuit common point, the IA has a gain G given by: G=2*(R2/R1) and an output voltage at current output node 108 given by 2*((VINP−VINN)/R1) *R2+$V_{ref}$.

Due to the folding of the buffer amplifier currents $I_{vinp}$ and $I_{vinn}$, the IA requires only one current mirror (104) in the IA's signal path, and provides good common mode rejection versus frequency. This reduces DC errors such as $V_{os}$ and $dV_{os}/dT$, etc.

Folding circuits 110 and 112 can comprise respective transistors biased with respective bias voltages, as shown in FIG. 7. Alternatively, folding circuits 110 and 112 could comprise respective virtual ground nodes such as those (50,52) shown in FIG. 3.

While particular embodiments of the invention have been shown and described, numerous variations and alternate embodiments will occur to those skilled in the art. Accordingly, it is intended that the invention be limited only in terms of the appended claims.

I claim:

1. A current-mode instrumentation amplifier (IA), comprising:
    first and second input terminals connected to receive a differential voltage (VINP−VINN);
    a first resistance element having a resistance R1;
    first and second buffer amplifiers having respective input nodes coupled to respective ones of said input terminals and respective output nodes providing first and second output voltages V1 and V2 which vary with VINP and VINN, respectively, said first amplifier including a first transistor (MN1) coupled between said first output node and a circuit common point and biased with a bias current $I_{bias1}$, and said second amplifier including a second transistor (MN2) coupled between said second output node and said circuit common point and biased with a bias current $I_{bias2}$;
    said first resistance element connected at a first terminal to said first output node and at a second terminal to said second output node such that said first resistance element conducts a current $I_{R1}$ which varies with V1−V2, said first transistor conducts a current $I_a=I_{bias1}-I_{R1}$ when VINP>VINN and a current $I_a=I_{bias1}+I_{R1}$ when VINP<VINN, and said second transistor conducts a current $I_b=I_{bias2}-I_{R1}$ when VINN>VINP and a current $I_b=I_{bias2}+I_{R1}$ when VINN<VINP;
    a current mirror arranged to mirror a current applied at a current input terminal to a current output terminal, said current output terminal coupled to a current output node;
    circuitry arranged to couple current $I_a$ to the current input terminal of said current mirror; and
    circuitry arranged to couple current $I_b$ to said current output node.

2. The IA of claim 1, further comprising a buffer amplifier connected to said current output node at its input and providing said IA's output voltage $V_{out}$ at its output.

3. The IA of claim 2, further comprising a second resistance element having a resistance R2 coupled between said current output node and said circuit common point such that said IA has a gain G given by:

$G=-2*(R2/R1)$.

4. The IA of claim 3, further comprising a reference voltage source connected in series between said second resistance element and said circuit common point to set $V_{out}$ to a desired center value when VINP−VINN is equal to a predetermined value.

5. The IA of claim 3, wherein said second resistance element comprises:
    a first resistor connected in series between a supply voltage and said current output node; and
    a second resistor connected in series between said current output node and said circuit common point, the resistances of said first and second resistors selected to set $V_{out}$ to a desired center value when VINP−VINN is equal to a predetermined value.

6. The IA of claim 2, wherein said buffer amplifier's inverting input is connected to said current output node and its non-inverting input is connected to a reference voltage $V_{ref}$, further comprising a second resistance element having a resistance R2 connected between said amplifier's output and its inverting input such that said IA has a gain G given by: G=2*(R2/R1).

7. The IA of claim 1, wherein said circuitry arranged to couple current $I_a$ comprises said first transistor and a third transistor (MN3) connected to mirror current $I_a$ to the current input terminal of said current mirror, and said circuitry arranged to couple current $I_b$ comprises said second transistor and a fourth transistor (MN4) connected to mirror current $I_b$ to said current output node.

8. The IA of claim 1, wherein said circuitry arranged to couple currents $I_a$ and $I_b$ comprises respective virtual ground nodes which fold currents $I_a$ and $I_b$ to said current mirror terminals, such that said current mirror is said IA's only current mirror.

9. The IA of claim 1, wherein said circuitry arranged to couple current $I_a$ comprises:
    said first transistor;
    a first fixed current source (70) connected between said first transistor and said circuit common point;
    a third transistor (MN5) having its control input connected to the junction of said fixed current source and said first transistor and its current circuit connected between a second fixed current source (72) and said circuit common point; and
    a fourth transistor (MN6) having its control input connected to the junction of said second fixed current source and said third transistor and its current circuit connected between said current mirror input terminal and the control input of said third transistor, such that said third and fourth transistors form a virtual ground node which stabilizes the voltage at the control input of said third transistor and said fourth transistor conducts a current which varies with current $I_a$.

10. The IA of claim 1, wherein said circuitry arranged to couple current $I_b$ comprises:
    said second transistor;
    a first fixed current source (76) connected between said first transistor and said circuit common point;
    a third transistor (MN7) having its control input connected to the junction of said fixed current source and said second transistor and its current circuit connected between a second fixed current source (78) and said circuit common point; and a fourth transistor (MN8) having its control input connected to the junction of said second fixed current source and said third transistor and its current circuit connected between said current mirror output terminal and the control input of said third transistor, such that said third and fourth transistors form a virtual ground node which stabilizes the voltage at the control input of said third transistor and said fourth transistor conducts a current which varies with current $I_b$.

11. The IA of claim 1, wherein said IA is chopper-stabilized such that it operates in accordance with a chopping cycle having first and second phases, said IA during said first phase arranged such that said IA's first and second input nodes are connected to said first and second input terminals, respectively, said IA's first and second output nodes are connected to said first resistance element's first and second terminals, respectively, and currents $I_a$ and $I_b$ are coupled to the current input and current output terminals, respectively, of said current mirror;

said IA during said second phase arranged such that said IA's first and second input nodes are connected to said second and first input terminals, respectively, and said IA's first and second output nodes are connected to said first resistance element's first and second terminals, respectively, and currents $I_a$ and $I_b$ are coupled to the current output and current input terminals, respectively, of said current mirror.

12. The IA of claim 11, wherein said chopping cycle has a duty cycle of 50%.

13. The IA of claim 11, wherein said current mirror is a chopped current mirror.

14. The IA of claim 13, wherein said current mirror is chopped at a different frequency than said IA.

15. The IA of claim 1, wherein said current mirror is a cascoded current mirror.

16. The IA of claim 1, wherein said IA is auto-zeroed.

17. A current-mode instrumentation amplifier (IA), comprising:

first and second input terminals connected to receive a differential voltage (VINP−VINN);

a first resistance element having a resistance R1;

first and second buffer amplifiers having respective input nodes coupled to respective ones of said input terminals and respective output nodes providing first and second output voltages V1 and V2 which vary with VINP and VINN, respectively, said first amplifier including a first field-effect transistor (FET) (MN1) coupled between said first output node and a circuit common point and biased with a bias current $I_{bias1}$, and said second amplifier including a second FET (MN2) coupled between said second output node and said circuit common point and biased with a bias current $I_{bias2}$;

said first resistance element connected at a first terminal to said first output node and at a second terminal to said second output node such that said first resistance element conducts a current $I_{R1}$ which varies with V1−V2, said first FET conducts a current $I_a = I_{bias1} - I_{R1}$ when VINP>VINN and a current $I_a = I_{bias1} + I_{R1}$ when VINP<VINN, and said second transistor conducts a current $I_b = I_{bias2} - I_{R1}$ when VINN>VINP and a current $I_b = I_{bias2} + I_{R1}$ when VINN<VINP;

a current mirror arranged to mirror a current applied at a current input terminal to a current output terminal, said current output terminal coupled to a current output node;

circuitry arranged to couple current $I_a$ to the current input terminal of said current mirror, said circuitry comprising:

a first fixed current source (70) connected between the source of said first FET and said circuit common point;

a third FET (MN5) having its gate coupled to the source of said first FET and its drain-source circuit connected between a second fixed current source (72) and said circuit common point; and a fourth FET (MN6) having its gate connected to the drain of said third FET and its drain-source circuit connected between said current mirror input terminal and the gate of said third FET, such that said third and fourth FETs form a virtual ground node which stabilizes the voltage at the gate of said third FET, and said fourth FET conducts a current which varies with current $I_a$; and circuitry arranged to couple current $I_b$ to said current output node, said circuitry comprising:

a third fixed current source (76) connected between the source of said second FET and said circuit common point;

a fifth FET (MN7) having its gate coupled to the source of said second FET and its drain-source circuit connected between a fourth fixed current source (78) and said circuit common point; and a sixth FET (MN8) having its gate connected to the drain of said fifth FET and its drain-source circuit connected between said current output node and the gate of said fifth FET, such that said fifth and sixth FETs form a virtual ground node which stabilizes the voltage at the gate of said fifth FET and said sixth FET conducts a current which varies with current $I_b$; and a second resistance element having a resistance R2 coupled between said current output node and said circuit common point, such that said IA has a gain G given by: G=2*(R2/R1);

said IA chopper-stabilized such that it operates in accordance with a chopping cycle having first and second phases, said IA during said first phase arranged such that said IA's first and second input nodes are connected to said first and second input terminals, respectively, the sources of said fourth and sixth FETs are connected to the gates of said third and fifth FETs, respectively, and the gates of said fourth and sixth FETs are connected to the drains of said third and fifth FETS, respectively;

said IA during said second phase arranged such that said IA's first and second input nodes are connected to said second and first input terminals, respectively, the sources of said fourth and sixth FETs are connected to the gates of said fifth and third FETs, respectively, and the gates of said fourth and sixth FETs are connected to the drains of said fifth and third FETs, respectively.

18. The IA of claim 17, wherein said first buffer amplifier comprises:

said first FET (MN1);

a seventh FET (MP1);

a current source (34) connected between a first node and said circuit common point and arranged to provide a bias current I1; and a current source (38) connected between a supply voltage and a second node and arranged to provide a bias current I3, wherein I3>I1, said seventh FET's gate coupled to said first input node, its drain connected to said first node, and its source connected to said second node, said first FET's gate connected to said first node, its source coupled to said circuit common point, and its drain connected to said second node, such that said seventh FET is biased by current I1 and said first FET's bias current $I_{bias1}$ is given by I3−I1;

and said second buffer amplifier comprises:

said second FET (MN2);

an eighth FET (MP2);

a current source (36) connected between a third node and said circuit common point and arranged to provide a bias current I2; and a current source (40) connected between a supply voltage and a fourth node and arranged to provide a bias current I4, wherein I4>I2, said eighth FET's gate connected to said second input node, its drain connected to said third node, and its source connected to said fourth node, said second FET's gate connected to said third node, its source coupled to said circuit common point, and its drain connected to said fourth node, such that said eighth FET is biased by current I2 and said second FET's bias current $I_{bias2}$ is given by I4−I2.

19. The IA of claim 17, further comprising a third buffer amplifier connected to said current output node at its input and providing said IA's output voltage $V_{out}$ at its output.

20. The IA of claim 19, wherein said third buffer amplifier's inverting input is connected to said current output node and its non-inverting input is connected to a reference voltage $V_{ref}$, said resistance R2 connected between said amplifier's output and its inverting input such that said IA has a gain G given by: G=2*(R2/R1).

21. A current-mode instrumentation amplifier (IA), comprising:

first and second input terminals connected to receive a differential voltage (VINP−VINN);

first and second buffer amplifiers having respective input nodes coupled to respective ones of said input terminals, and respective output nodes;

a resistance R1 connected between said output nodes, said amplifiers arranged such that the amplifier coupled to VINP produces a signal current $I_{vinp}$ equal to (VINP−VINN)/R1 and the amplifier coupled to VINN produces a signal current $I_{vinn}$ equal to (VINN−VINP)/R1;

a current mirror having input and output terminals, said output terminal being said IA's current output node, said current mirror being the only current mirror is said IA's signal path;

a first folding circuit which folds signal current $I_{vinp}$ to one of said current mirror terminals; and a second folding circuit which folds signal current $I_{vinn}$ to the other of said current mirror terminals.

22. The IA of claim 21, wherein said first and second folding circuits comprise respective transistors biased with respective bias voltages.

23. The IA of claim 21, wherein said first and second folding circuits comprise respective virtual ground nodes.

24. The IA of claim 21, further comprising:

a resistance R2; and a reference voltage source, said resistance R2 and said reference voltage source connected in series between said current output node and a circuit common point to set $V_{out}$ to a desired center value when VINP−VINN is equal to a predetermined value;

such that said IA has a gain G given by: G=2*(R2/R1) and an output voltage at said current output node given by 2*((VINP−VINN) /R1)*R2+$V_{ref}$.

* * * * *